US005084131A

United States Patent [19]

Inoue et al.

[11] Patent Number: 5,084,131

[45] Date of Patent: Jan. 28, 1992

[54] FABRICATION METHOD FOR THIN FILM ELECTROLUMINESCENT PANELS

[75] Inventors: Mayumi Inoue, Moriguchi; Kohji Matsunaga, Katano; Tomizoh Matsuoka, Neyagawa, all of Japan

[73] Assignee: Matsushita Electric Industrial Co., Ltd., Osaka, Japan

[21] Appl. No.: 638,867

[22] Filed: Jan. 11, 1991

[30] Foreign Application Priority Data

Jan. 11, 1990 [JP] Japan .................................... 2-4167

[51] Int. Cl.⁵ ............................................ H01L 21/00

[52] U.S. Cl. .................................. 156/656; 156/664; 156/665; 156/637; 156/655

[58] Field of Search ............... 156/656, 664, 665, 637, 156/655

[56] References Cited

U.S. PATENT DOCUMENTS

| | | | |
|---|---|---|---|
| 3,855,112 | 12/1974 | Tomozawa et al. | 156/655 |
| 3,890,636 | 6/1975 | Harada et al. | 357/68 |
| 3,988,254 | 10/1976 | Mori | 156/665 |
| 4,324,841 | 4/1982 | Huang | 156/665 |
| 4,653,858 | 3/1987 | Szydlo et al. | 156/656 |
| 4,959,105 | 9/1990 | Neidiffer | 252/79.4 |

*Primary Examiner*—David A. Simmons
*Assistant Examiner*—George A. Goudreau
*Attorney, Agent, or Firm*—Wenderoth, Lind & Ponack

[57] ABSTRACT

A fabrication method for thin film electroluminescent panels including steps of forming a composite film by depositing Ni film on Al film for forming back electrodes and lead-out electrodes, forming a resist pattern on the composite film and etching the composite film into a predetermined pattern so as to form back electrodes and lead-out electrodes using an etchant containing phosphoric acid of 3.5 to 13.0 mol/l, sulphuric acid of 0.1 to 9.0 mol/l, nitric acid of 0.1 to 8.0 mol/l and acetic acid of 0.0 to 8.0 mol/l.

4 Claims, 4 Drawing Sheets

FABRICATION METHOD FOR THIN FILM ELECTROLUMINESCENT PANELS

BACKGROUND OF THE INVENTION

1. Field of the Invention

The present invention relates to a fabrication method for thin film electroluminescent panels used for displaying character and graphic images and more particularly to a forming method of back electrodes and lead-out electrodes.

2. Description of Related Art

Conventionally, there has been known an X-Y matrix display panel as a solid display panel using electroluminescent devices. In this panel, horizontal electrodes and vertical electrodes are arranged on respective surfaces of an electroluminescent layer so as to be orthogonal to each other and the electroluminescent layer emits light at each crossing area of horizontal electrodes and vertical electrodes when signals are applied via a switching device, to lead-out electrodes selectively. (Hereinafter, a luminescent area at the above crossing area is referred to as a pixel). Characters and graphics are displayed by choosing luminant pixels. In fabrication of the display panel of this type, transparent electrodes are formed on a transparent substrate such as a glass plate, then, a first dielectric layer, a phosphor layer and a second dielectric layer are stacked thereon successively and, further, back electrodes are formed on the second dielectric layer so as to cross the transparent electrodes orthogonally. Finally, lead-out electrodes are formed at predetermined positions. Usually, tin oxide or tin doped indium oxide (hereinafter referred to as ITO) is deposited on a flat glass substrate to form transparent electrodes. Metal films such as aluminum film and nickel film are formed as back electrodes and lead-out electrodes by a deposition method such as vacuum deposition.

The conventional forming methods of back electrodes and lead-out electrodes are as follows.

FIRST METHOD

After forming lead-out electrodes by vacuum-depositing a metal film such as Ni/Cr film on an area to be formed with use of a metal mask, and Al film is formed on a predetermined area to form a resist pattern. Thereafter, the resist pattern is etched to form back electrodes.

SECOND METHOD

After forming back electrodes, the phosphor layer is sealed using a glass plate as a moisture resistant protection seal for the panel. Thereafter, lead-out electrodes are formed on a predetermined area by Ni-plating. (See, for example, EL panel FINLUX MD 640.400 offered by ROHIA corporation.)

THIRD METHOD

After forming an Al film, a Ni film is formed on a predetermined area for lead-out electrodes to be formed and, thereafter, a resist pattern is formed. Thereafter, lead-out electrodes and back electrodes are formed by performing sequential or simultaneous etching (See, for example, Japanese patent laid open publication No. S 59-27497 or H 2-142089.)

FOURTH METHOD

After forming Al film and Ni film on areas for forming lead-out electrodes and back electrode simultaneously, a resist pattern is formed. Thereafter, by performing a sequential etching, lead-out electrodes and back electrodes are formed (See, for example, Japanese patent publication No. S 60-58795.)

FIFTH METHOD

After forming Al film and Ni film on areas for forming lead-out electrodes and back electrodes simultaneously, a resist pattern is formed.

Thereafter, by performing a simultaneous etching using an etchant including phosphoric acid, nitric acid and acetic acic, lead-out electrodes and back electrodes are formed. (See, for example, Japanese patent publication No. S 63-46151.)

In the first method, it becomes very complicated due to shifts of patterns caused by extension and contraction of the metal mask to perform a photolithographic process needed for alignment of back electrodes with lead-out electrodes upon forming back electrodes.

In the case of the second method, the process becomes very complicated because forming and removing processes of common electrodes are needed additionally in the electrolytic plating method. When an elecroless plating method is employed in place of the electrolytic one, the glass substrate and transparent electrodes are damaged by the pretreatment liquid use therefor.

In the case of the third method, the resist pattern is etched sequentially or simultaneously after forming Al film and Ni film sequentially. Namely, electrodes are formed after performing film forming processes twice in this case, however, the sequential etching makes the process complicated. As to the etchant capable of etching Ni film and Al film simultaneously, there has been known a mixed solution containing phosphoric acid and nitric acid. However, in the case of the former solution, it becomes difficult to maintain patterns of electrodes so as to have predetermined dimensions if the density of hydrochloric acid is high. Contrary to this, if the density of hydrochloric acid is low, the etching becomes imhomogeneous. On the other hand, in the case of the latter solution, since it is difficult to etch the surface oxide film of Ni film only by nitric acid, the etching speed becomes too low to perform the etching.

Also, a solution comprised of phosphoric acid 1.5 mol/l, sulphuric acid 1.0 mol/l, nitric acid 5.0 mol/l and acetic acid 9.0 mol/l has been proposed as an etchant capable of etching the surface oxide film of Ni film by Fuyama et al. (See "Vacuum" vol. 32 and vol. 9, 1989). However, in the case of etching a composite film of Ni and Al by the above etchant, the etching speed of Al is very low when compared with that of Ni, it is difficult to guarantee the accuracy of the pattern width in the simultaneous etching using the above solution. Fuyama et al. also proposed a solution comprised of phosphoric acid 3.0 mol/l, sulphuric acid 3.5 mol/l and nitric acid 10.0 mol/l, however, in this case, the resist is peeled off during the etching since the density of nitric acid is too high.

In the case of the fourth method, although the film forming process is simplified due to the simultaneous etching of Al film and Ni film, the etching poscess becomes complicated since the etching is performed twice.

In the case of the fifth method, it is difficult to etch Ni film by the etchant comprised of phosphoric acid, nitric acid and a acetic acid similarly to the case of the etchant comprised of phosphoric acid and nitric acid used in the third method.

SUMMARY OF THE INVENTION

An essential object of the present invention is to reduce the fabrication cost by forming back electrodes and lead-out electrodes simultaneously to simplify the fabrication process among fabrication processes of thin film EL panels.

In order to achieve the object, according to the present invention, transparent electrodes, a first dielectric layer, an EL layer and a second dielectric layer are deposited on a translucent substrate sequentially and, more over, Al as back electrodes and Ni as lead-out electrodes are deposited thereon. Thereafter, the composite film of Al and Ni is etched by an etchant comprised of phosphoric acid of 3.5 to 13.0 mol/l, sulphuric acid of 0.1 to 9.0 mol/l, nitric acid of 0.1 to 8.0 mol/l and acetic acid of 0.0 to 8.0 mol/l so as to form predetermined patterns.

According to this method, it becomes possible to perform a simultaneous etching for forming back electrodes and lead-out electrodes while, according to the conventional method, the etching is performed for back electrodes and for lead-out electrodes separately.

Due to this, the fabrication process can be simplified and thin film EL panels made are cheap and have a high credibility.

BRIEF DESCRIPTION OF THE DRAWINGS

These and other objects and features of the present invention will become clear from the following description taken in conjunction with the preferred embodiment thereof with reference to the accompanying drawings, in which.

DETAILED DESCRIPTION OF THE PREFERRED EMBODIMENT

Figure 1:
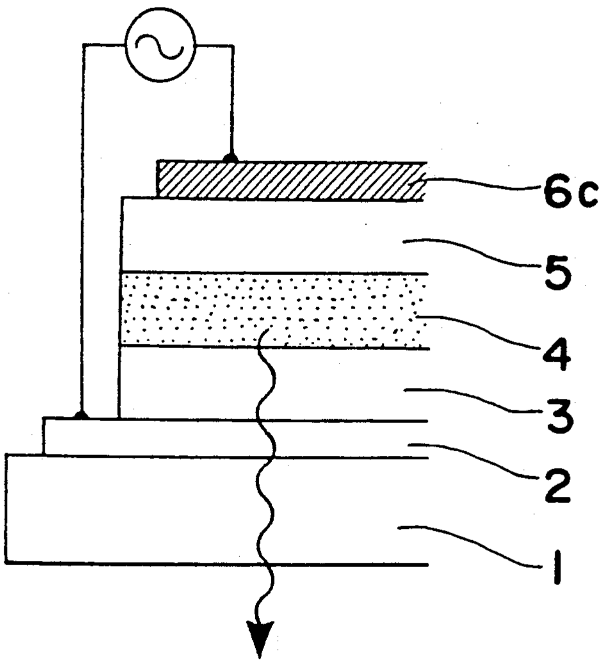
FIG. 1 is a schematic sectional view illustrating a structure of a thin film EL panel.

As shown in FIG. 1, a thin film EL panel is comprised of a translуent substrate 1 made of glass or the like, transparent electrodes 2 being formed in a stripe pattern by photolithography after forming a thin film of ITO, $SnO_2$ or ZnO, a first dielectric layer 3 of $Al_2O_3$, $SrTiO_3$ or $Si_3N_4$ formed by sputtering, a phosphor layer 4 of ZnS:Mn, SrS:Ce or CaS:Eu formed by vacuum deposition, a second dielectric layer 5 of $BaTa_2O_6$, $Y_2O_3$ or $Ta_2O_5$ formed by sputtering and back electrodes 6*c* formed in a stripe pattern so as to be orthogonal to said transparent electrodes 2 after vacuum-depositing Al or ITO. Electroluminescence is caused by applying a high voltage between a back electrode 6*c* and a transparent electrode 2.

Figure 2:
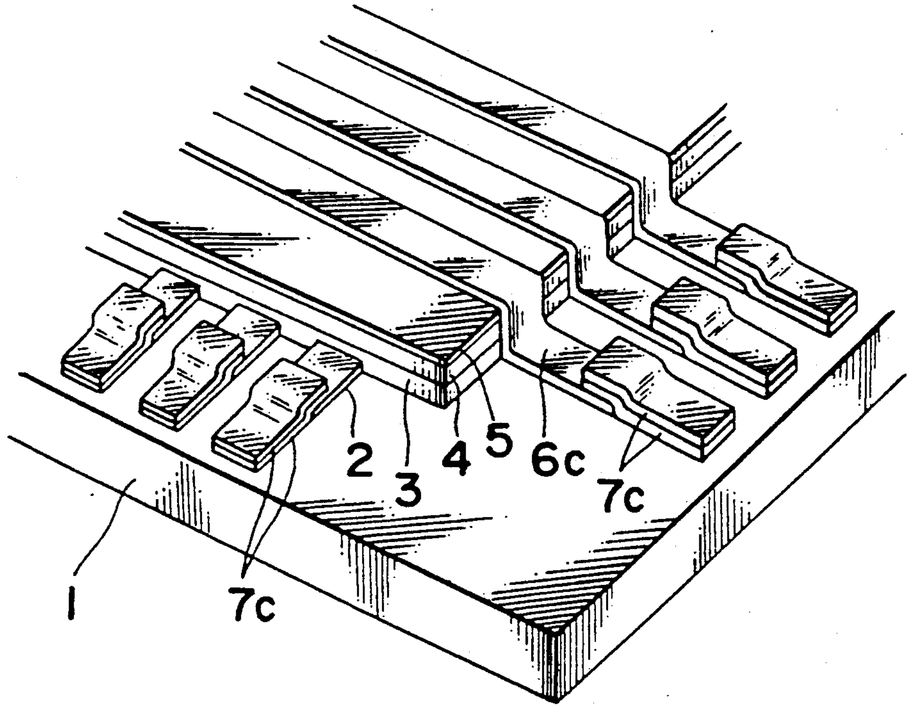
FIG. 2 is a partial perspective view illustrating a relation between back electrodes and lead-out electrodes of the thin film EL panel, FIG. 3(*a*), 3(*b*), 3(*c*) and 3(*d*) are schematic sectional views illustrating the lithographic process for forming electrodes from a composite film of Al and Ni according to the present invention, FIGS. 4(*a*), 4(*b*), 4(*c*), 4(*d*), 4(*e*), 4(*f*), 4(*g*) and 4(*h*) are schematic sectional views illustrating the fabrication process of the thin film EL pannes according to the present invention and FIGS. 5(*a*), 5(*b*), 5(*c*), 5(*d*), 5(*e*), 5(*f*), 5(*g*) and 5(*h*) are schematic plan views corresponding to FIGS. 4(*a*) to 4(*h*), respectively.
Figure 3A:
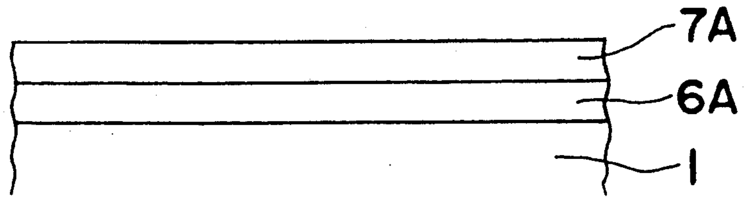
Figure 3B:
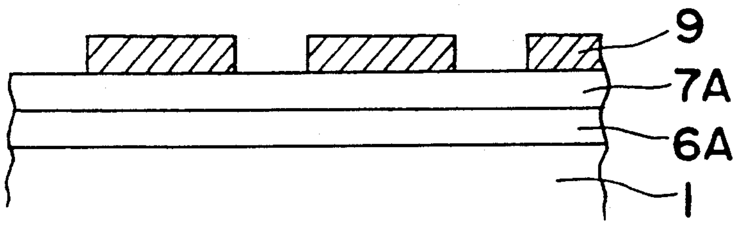
Figure 3C:
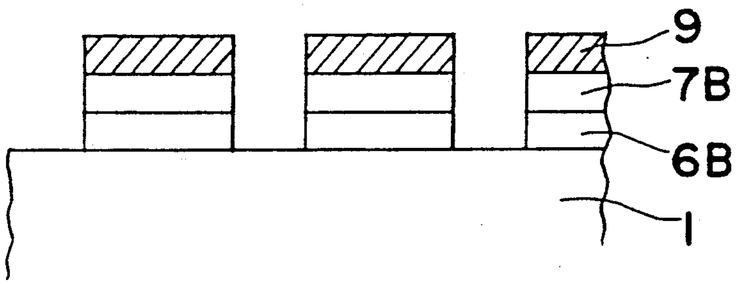
Figure 3D:
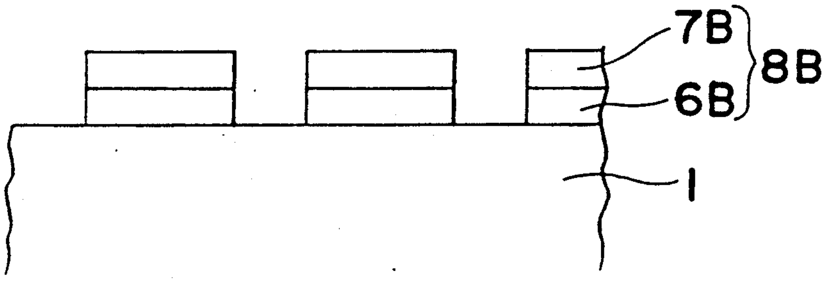
Figure 4A:
Figure 4B:
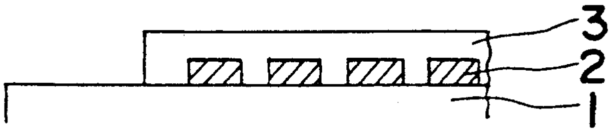
Figure 4C:
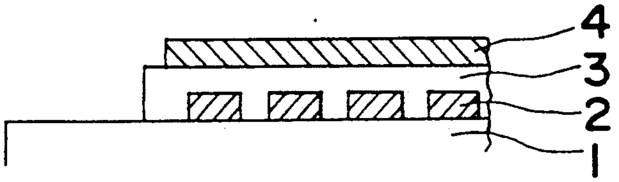
Figure 4D:
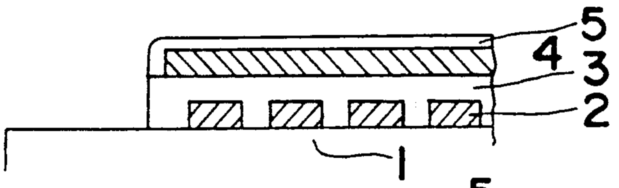
Figure 4E:
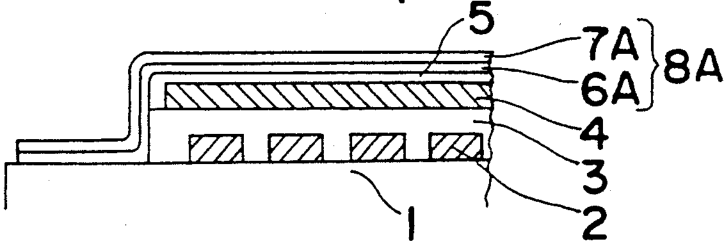
Figure 4F:
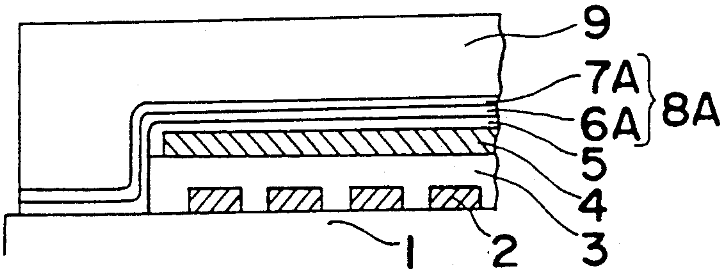
Figure 4G:
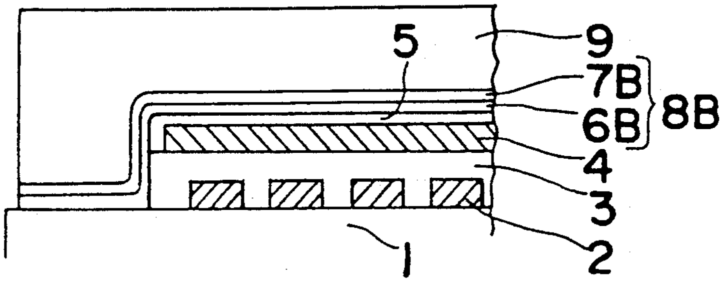
Figure 4H:
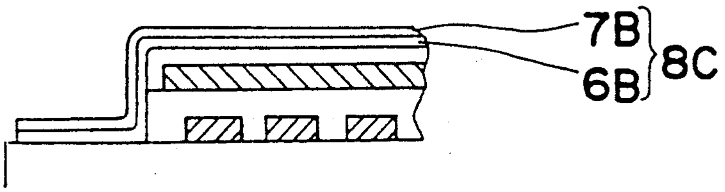
Figure 5A:
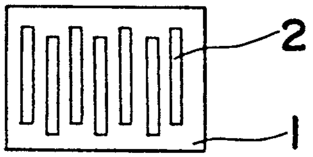
Figure 5B:
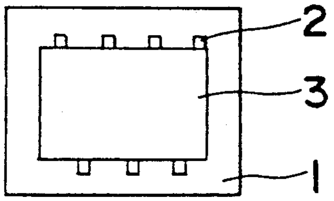
Figure 5C:
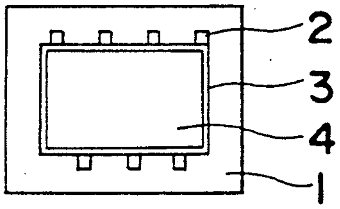
Figure 5D:
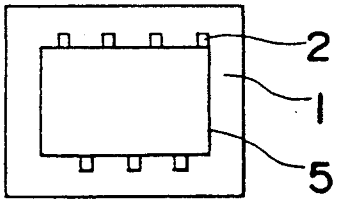
Figure 5E:
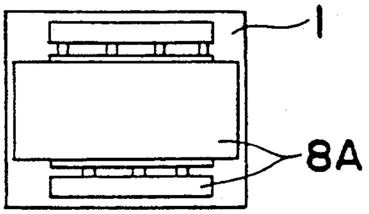
Figure 5F:
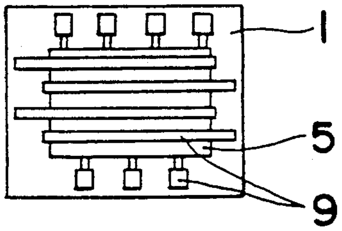
Figure 5G:
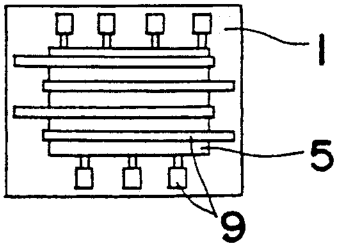
Figure 5H:
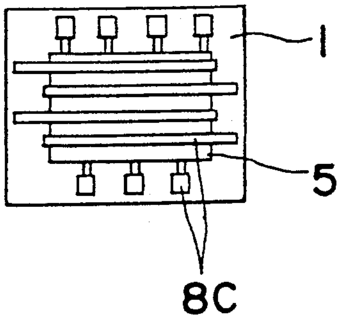

As shown in FIG. 2, lead-out electrodes 7 and 7*c* are provided for connecting respective transparent electrode 2 and respective back electrodes 7*c* to a driving circuit (not shown) for driving the EL panel to display characters or graphic images. The back electrodes 6*c* and the lead-out electrodes 7 and 7*c* are patternized simultaneously by etching after vacuum-depositing Ni/Cr or Ti/Al on areas including end portions of back electrodes 6*c* and transparent electrodes 2. As an etchant, a solution comprised of phosphoric 3.5 to 13.0 mol/l, sulphuric acid 0.1 to 9.0 mol/l, nitric acid 0.1 to 8.0 mol/l and acetic acid 0.0 to 8.0 mol/l is used.

EXAMPLE 1

FIGS. 3(*a*) to 3(*d*) shows steps for forming electrodes according to the present invention.

As shown in FIG. 3(*a*), Al film 6A of about 200 nm thickness is formed on a glass substrate 1 by the vacuum deposition and, thereafter, Ni film 7A of about 200 nm thickness on the Al film 6A by the vacuum deposition.

As shown in FIG. 3(*b*), a stripe like resist pattern 9 having a width of 160 μm is formed on the composite film 8A by photolithography with the use of a posiresist "Microposit 1400-31" offered by Sypay Shipley Co.

As shown in FIG. 3(*c*), the etching treatment for the composite film 8A is performed etchants as indicated in Table 1.

After removing the resist pattern 9 as shown in FIG. 3(*d*), the composite electrodes 8*a* thus formed were observed. The results thereof are shown in Table 1.

The reason why a mixed acid is used is that it is impossible to etch plural films simultaneously only by one acid. Respective roles of the acids in the mixed acid are as follows. Phosphoric acid is an etchant for Al, sulphuric acid is for removing the surface oxide film formed on the Ni film 7A, nitric acid is for etching the Ni film 7A and for homogeneous etching of the Al film 6A and acetic acid is a dilution for these acids.

Respective densities of the acids contained in the etchant are to be determined from the total evaluation of patterning properties such as etching speed, the accuracy of the pattern width, the durability of the resist and the like.

The evaluation for the fitness of the etching speed is indicated by three marks ○, Δ, and × in Table 1.

The mark ○ indicates etchants having a ratio of the etching speed $t_1$ against Ni to that $t_2$ against Al equal to or smaller than 5, the mark Δ indicates etchants having a ratio larger than 5 and the mark × indicates etchants impossible to etch. If the speed ratio ($t_1/t_2$) is larger than 5, either one of two films 6A and 7A is etched too much resulting in a narrow pattern width.

The accuracy of the pattern width is classified into three classes based on a difference between the pattern width $w_2$ after completion of the etching and the initial resist pattern width $w_1$. In Table 1, the mark ○ indicates the difference is equal to or smaller than 2%, the mark Δ indicates it is larger than 2% and smaller than 5% and the mark × indicates it is larger than 5%.

As to the durability of the resist, the mark × indicates the resist is peeled off in the etching, the mark Δ indicates the resist is peeled off after the etching and the mark ○ indicates the resist is never peeled off in and after the etching.

As is apparent from Table 1, samples Nos. 5, 6, 7, 14, 15, 16, 17, 26, 27, 28, 33, 34 and 35 exhibit excellent patterning properties and sample No. 6 gives the best result.

If the density of phosphoric acid becomes smaller than 3.5 mol/l as in the samples Nos. 1 and 2, it becomes difficult to etch Al and, therefore, the simultaneous etching of the composite film of Al and Ni becomes impossible. If it exceeds 13 mol/l as in the sample No. 10, the etching of Ni becomes difficult since contents of sulphuric acid and nitric acid become too small to etch Ni effectively. If the density of sulphuric acid is zero as in the sample No. 11, the etching of Ni was impossible. If it becomes smaller than 0.5 mol/l, the etching of Ni becomes difficult as in the samples Nos. 12 and 13. Contrary to this, if it exceeds 9.0 mol/l as in the samples 21 and 22, the resist film is peeled off in the etching process.

If the density of nitric acid is zero as in the sample No. 23, the etching of Ni and Al is impossible. If it becomes smaller than 0.5 mol/l the etching of Ni and Al becomes difficult. On the other hand, if it exceeds 8.0 mol/l as in the samples Nos. 31 and 32, the resist film was peelied off in the etching process.

As to the peeling off of the resist film, when the sum of densities of sulphuric acid and nitric acid exceeded 8 mol/l, the peeling off of the resist film was sometimes observed.

As to the density of acetic acid, water can be substituted for acetic acid since it functions merely as a dilution. However, when water is used, the etching speed is apt to lower. Accordingly, it is desirable to use acetic acid. However, if the density of acetic acid exceeds 8 mol/l as in the samples Nos. 2 and 38, contents of other acids become too small and, thereby, the etching speed of Al becomes smaller than 10 mm and the ratio of the etching speed of Ni to that of Al becomes too large. Due to this, the stripe width of Ni becomes too narrow. Or, the etching speed of Ni becomes too small to perform the effective etching. As shown in Table 1, the etching of the composite film of Al and Ni was performed at various densities of the mixed acid other than those mentioned above.

As the result of this, it was confirmed that Al film and Ni film can be etched simultaneously using an etchant containing phosphoric acid of 3.5 to 13.0 mol/l, sulphuric acid of 0.1 to 9.0 mol/l, nitric acid of 0.1 to 8.0 mol/l and acetic acid of 0.0 to 8.0 mol/l. However, when taking optimization of the pattern accuracy, speed up of the etching, the resistivity of the resist pattern and the like into consideration, it is desirable to use an etchant containing phosphoric acid of 7.0 to 10.0 mol/l, sulphuric acid of 0.5 to 4.0 mol/l, nitric acid of 0.5 to 4.0 mol/l, and acetic acid of 0.0 to 3.0 mol/l. In this case, one hundred or more samples each of which Al film and Ni film are formed on a glass substrate of 180×240 $mm^2$ can be etched simultaneously at an excellent pattern accuracy.

EXAMPLE 2

The second example of the present invention is explained with reference of FIGS. 4(*a*), to 4(*h*), and 5(*a*) to 5(*h*).

As shown in FIGS. 4(*a*) and 5(*a*), an ITO film of 600 nm thickness is formed on a glass substrate 1 at a substrate temperature of 450° C. by the sputtering method at first and, then, transparent electrodes 2 are formed in a stripe pattern having a pattern width of 160 μm and a pitch of 200 μm by the photolighography and etching with use of a suitable mask.

Next, as shown in FIGS. 4(*b*) and 5(*b*), $Al_2O_3$ film as the first dielectric layer 3 is formed so as to have a thickness of 300 nm on a predetermined area of the substrate 1 at a substrate temperature of 200° C. by the sputtering method. Thereafter, as shown in FIGS. 4(*c*) and 5(*c*), a phosphor layer 4 comprised by ZnS and Mn is formed so as to have a thickness of 500 nm at a substrate temperature of 200° C. on a predetermined area of the first dielectric layer 3 by the coevaporation method.

Next, as shown in FIGS. 4(*d*) and 5(*d*), $BaTa_2O_6$ thin film as the second dielectric layer 5 is formed so as to have a thickness of 200 nm at a substrate temperature of 150° C. by the sputtering method after activating the phosphor layer 4 by subjecting the same to a thermal treatment at a temperature of 550° C. in a vacuum for one hour.

Then, as shown in FIGS. 4(*e*) and 5(*e*), Al film 6A of a thickness 250 nm and Ni film 7A of a thickness 300 nm are formed successively on a predetermined area at a substrate temperature of 200° C. by the sputtering method or the like.

As shown in FIGS. 4(*f*) and 5(*f*), a photoresist pattern 9 is formed so as to have a pattern width of 230 μm and a pitch of 300 μm by the photolithography.

Finally, as shown in FIGS. 4(*g*) and 5(*g*), the simultaneous etching of Ni film 7A and Al film 6A is performed at a temperature of 30° C. using the etchant of the sample No. 6 in the Table 1 which is a mixture of phosphoric acid, sulphuric acid, nitric acid and acetic acid and the resist pattern 9 is removed. Thus, as shown in FIGS. 4(*h*) and 5(*h*), back electrodes 6*c* and lead-out electrodes 7*c* are formed.

The film EL panel fabricated according to the process mentioned above has few damanges on the phosphor layer and the yield of product is highly enhanced.

In the above preferred embodiment, the present invention is applied for the simultaneous etching of the compositie film in the fabrication process of EL panels. But the present invention is not limited to this and the etchant according to the present invention is applicable for forming electrodes of the liquid crystal display panel or the plasma display panel.

It is understood that various other modifications will be apparent to and can be readily made by those skilled in the art without departing from the scope and spirit of the present invention. Accordingly, it not intended that the scope of the claims appended hereto be limited to the description as set forth herein, but rather that the claims be construed as encompassing all the features of patentable novelty that reside in the present invention, including all features that would be treated as equivalents thereof by those skilled in the art to which the present invention pertains.

TABLE 1

| | Density(mol/l) | | | | Fitness of | Accuracy | | |
|---|---|---|---|---|---|---|---|---|
| No | phosphoric acid | sulphuric acid | nitric acid | acetic acid | etching speed | of pattern width | Durability of rosist | Total evaluation |
| 1 | 0 | 2 | 3 | 2 | X | X | ○ | X |
| 2 | 2 | 2 | 3 | 2 | Δ | X | ○ | X |
| 3 | 3.5 | 2 | 3 | 2 | Δ | Δ | ○ | Δ |
| 4 | 5 | 2 | 3 | 2 | Δ | Δ | ○ | Δ |

TABLE 1-continued

| | Density(mol/l) | | | | Fitness of | Accuracy | | |
|---|---|---|---|---|---|---|---|---|
| No | phosphoric acid | sulphuric acid | nitric acid | acetic acid | etching speed | of pattern width | Durability of rosist | Total evaluation |
| 5 | 7 | 2 | 3 | 2 | ○ | ○ | ○ | ○ |
| 6 | 9 | 2 | 3 | 2 | ○ | ○ | ○ | ○ |
| 7 | 10 | 2 | 3 | 0 | ○ | ○ | ○ | ○ |
| 8 | 12 | 1 | 1.5 | 0 | Δ | Δ | ○ | Δ |
| 9 | 13 | 1 | 1 | 0 | Δ | Δ | ○ | Δ |
| 10 | 14 | 0.3 | 0.5 | 0 | Δ | X | ○ | X |
| 11 | 9 | 0 | 3 | 2 | X | X | ○ | X |
| 12 | 9 | 0.1 | 3 | 2 | Δ | Δ | ○ | Δ |
| 13 | 9 | 0.3 | 3 | 2 | Δ | Δ | ○ | Δ |
| 14 | 9 | 0.5 | 3 | 2 | ○ | ○ | ○ | ○ |
| 15 | 9 | 1 | 3 | 2 | ○ | ○ | ○ | ○ |
| 16 | 9 | 3 | 3 | 2 | ○ | ○ | ○ | ○ |
| 17 | 9 | 4 | 3 | 0 | ○ | ○ | ○ | ○ |
| 18 | 8 | 7 | 1 | 0 | ○ | ○ | Δ | Δ |
| 19 | 7 | 9 | 0.5 | 0 | ○ | ○ | Δ | Δ |
| 20 | 6 | 9 | 1.5 | 0 | ○ | ○ | Δ | Δ |
| 21 | 6 | 10 | 0.5 | 0 | ○ | ○ | X | X |
| 22 | 5 | 10 | 1.5 | 0 | ○ | ○ | X | X |
| 23 | 9 | 2 | 0 | 2 | X | X | ○ | X |
| 24 | 9 | 2 | 0.1 | 2 | Δ | Δ | ○ | Δ |
| 25 | 9 | 2 | 0.3 | 2 | Δ | Δ | ○ | Δ |
| 26 | 9 | 2 | 0.5 | 2 | ○ | ○ | ○ | ○ |
| 27 | 9 | 2 | 2 | 2 | ○ | ○ | ○ | ○ |
| 28 | 9 | 2 | 4 | 0 | ○ | ○ | ○ | ○ |
| 29 | 7 | 1 | 7 | 0 | ○ | ○ | Δ | Δ |
| 30 | 6 | 1 | 8 | 0 | ○ | ○ | Δ | Δ |
| 31 | 6 | 0.5 | 9 | 0 | Δ | Δ | X | X |
| 32 | 5 | 1.5 | 9 | 0 | Δ | Δ | X | X |
| 33 | 9 | 2 | 3 | 0 | ○ | ○ | ○ | ○ |
| 34 | 9 | 2 | 3 | 1 | ○ | ○ | ○ | ○ |
| 35 | 9 | 2 | 2 | 3 | ○ | ○ | ○ | ○ |
| 36 | 7 | 1 | 1 | 7 | Δ | ○ | ○ | Δ |
| 37 | 6 | 1 | 1 | 8 | Δ | ○ | ○ | Δ |
| 38 | 5 | 1 | 1 | 9 | Δ | X | ○ | X |

What is claimed is:

1. Fabrication method for thin film electroluminescent panels including the following steps of depositing transparent electrodes, first dielectric layer, phosphor layer, second dielectric layer and composite film for Al and Ni for forming back electrodes and lead-out electrodes of said transparent electrodes and said back electrodes on a transparent substrate successively, forming a resist pattern on said composite film, and etching said composite film so as to form a predetermined pattern using an etchant containing phosphoric acid of 3.5 to 13.0 mol/l, sulphuric acid of 0.1 to 9.0 mol/l, nitric acid of 0.1 to 8.0 mol/l and acetic acid of 0.0 to 8.0 mol/l.

2. The fabrication method as claimed in claim 1 in which said etchant is an etchant containing phosphoric acid of 7.0 to 10.0 mol/l, sulphuric acid of 0.5 to 4.0 mol/l, nitric acid of 0.5 to 4.0 mol/l and acetic acid of 0.0 to 3.0 mol/l.

3. Fabrication method for electrodes of a display panel including steps of forming a composite film by depositing a metal film including Ni as a main component on a metal film including Al as a main component, forming a resist pattern on said composite film and etching said composite film so as to form a predetermined pattern using an etchant containing phosphoric acid of 3.5 to 13.0 mol/l, sulphuric acid of 0.1 to 9.0 mol/l, nitric acid of 0.1 to 8.0 mol/l and acetic acid of 0.0 to 8.0 mol/l.

4. The fabrication method as claim in claim 3 in which said etchant is an etchant containing phosphoric acid of 7.0 to 10.0 mol/l, sulphuric acid of 0.5 to 4.0 mol/l, nitric acid of 0.5 to 4.0 mol/l and acetic acid of 0.0 to 3.0 mol/l.

* * * * *